US012561503B2

(12) United States Patent
Woo et al.

(10) Patent No.: US 12,561,503 B2
(45) Date of Patent: Feb. 24, 2026

(54) METHOD OF PREDICTING CHARACTERISTIC OF SEMICONDUCTOR DEVICE AND COMPUTING DEVICE PERFORMING THE SAME

(71) Applicant: Samsung Electronics Co., Ltd., Suwon-si (KR)

(72) Inventors: Sola Woo, Gwacheon-si (KR); Gwangnae Gil, Yongin-si (KR); Seyoung Park, Hwaseong-si (KR); Jonghyun Lee, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 982 days.

(21) Appl. No.: 17/724,009

(22) Filed: Apr. 19, 2022

(65) Prior Publication Data
US 2023/0113207 A1 Apr. 13, 2023

(30) Foreign Application Priority Data
Oct. 13, 2021 (KR) ........................ 10-2021-0135526

(51) Int. Cl.
*G06F 30/3308* (2020.01)
*G06F 30/31* (2020.01)

(52) U.S. Cl.
CPC .......... *G06F 30/3308* (2020.01); *G06F 30/31* (2020.01)

(58) Field of Classification Search
CPC ...... G06F 30/27; G06F 30/31; G06F 30/3308; G06F 2111/20; G06F 2119/18
See application file for complete search history.

(56) References Cited

U.S. PATENT DOCUMENTS 8,200,527 B1 * 6/2012 Thompson ............. G06Q 30/00
705/7.41
10,796,050 B2 10/2020 Kim
(Continued)

FOREIGN PATENT DOCUMENTS

CA 3096415 A1 * 10/2019 .......... G06V 10/764
CN 108984733 A * 12/2018 .......... G06F 21/602
(Continued)

OTHER PUBLICATIONS

Lysenko et al, "The Use of the TCAD in Technology Simulation for Increasing the Efficiency of Semiconductor Manufacturing", 2016 (Year: Oct. 2016).*
(Continued)

*Primary Examiner* — Rehana Perveen
(74) *Attorney, Agent, or Firm* — Fish & Richardson P.C.

(57) ABSTRACT
To predict characteristics of a semiconductor device, basic training data corresponding to a combination of input data and simulation result data are generated using a technology computer aided design (TCAD) simulator. The TCAD simulator generates the simulation result data by performing a simulation based on the input data of the TCAD simulator such that the simulation result data indicates characteristics of semiconductor devices corresponding to the input data of the TCAD simulator. A deep learning model is trained based on the basic training data such that the deep learning model is configured to output prediction data indicating the characteristics of the semiconductor devices. Target prediction data is generated based on the deep learning model and input data corresponding to the target semiconductor product such that the target prediction data indicates the characteristics of the semiconductor device included in the target semiconductor product.

15 Claims, 16 Drawing Sheets

(56) References Cited

U.S. PATENT DOCUMENTS

| | | | |
|---|---|---|---|
| 10,943,049 B2 | 3/2021 | Chuang et al. | |
| 11,348,017 B1 * | 5/2022 | Wong | G06N 20/00 |
| 2013/0289965 A1 * | 10/2013 | Joshi | G06F 30/39 |
| | | | 703/13 |
| 2020/0150601 A1 * | 5/2020 | Valpola | G05B 13/04 |
| 2021/0063999 A1 | 3/2021 | Kim et al. | |
| 2021/0150387 A1 | 5/2021 | Rothstein et al. | |
| 2021/0158147 A1 * | 5/2021 | Vinod | G06N 3/08 |

FOREIGN PATENT DOCUMENTS

| | | | | | |
|---|---|---|---|---|---|
| CN | 112446875 A | * | 3/2021 | .......... | G06F 18/214 |
| CN | 113033702 A | * | 6/2021 | ............ | G06N 3/045 |
| CN | 113139568 A | * | 7/2021 | ............ | G06F 18/24 |

| | | | | | |
|---|---|---|---|---|---|
| JP | 2019-0021123 A | | 2/2019 | | |
| JP | 2020-0184123 A | | 11/2020 | | |
| KR | 20200054414 A | | 5/2020 | | |
| KR | 20200110979 A | * | 9/2020 | ........ | G05B 23/0283 |
| KR | 10-2021-0025461 A | | 3/2021 | | |
| KR | 10-2230354 B1 | | 3/2021 | | |
| KR | 10-2021-0066545 A | | 6/2021 | | |

OTHER PUBLICATIONS

Ibrahim et al, "Semiconductor Fabrication Strategy for Cycle Time and Capacity Optimization: Past and Present", pp. 2798-2807, Mar. 2016 (Year: 2016).*

Backer et al, "Taking the Next Leap Forward in Semiconductor Yield Improvement", Apr. 2018 (Year: 2018).*

* cited by examiner

FIG. 1

START

GENERATE BASIC TRAINING DATA CORRESPONDING TO A COMBINATION OF INPUT DATA AND SIMULATION RESULT DATA OF PREVIOUS SEMICONDUCTOR PRODUCTS USING A TECHNOLOGY COMPUTER AIDED DESIGN (TCAD) SIMULATOR, THE TCAD SIMULATOR GENERATING THE SIMULATION RESULT DATA BY PERFORMING A SIMULATION BASED ON THE INPUT DATA, THE SIMULATION RESULT DATA INDICATING CHARACTERISTICS OF SEMICONDUCTOR DEVICES CORRESPONDING TO THE INPUT DATA — S100

TRAIN A DEEP LEARNING MODEL BASED ON THE BASIC TRAINING DATA SUCH THAT THE DEEP LEARNING MODEL IS CONFIGURED TO OUTPUT PREDICTION DATA INDICATING THE CHARACTERISTICS OF THE SEMICONDUCTOR DEVICES — S200

GENERATE TARGET PREDICTION DATA BASED ON THE DEEP LEARNING MODEL AND THE INPUT DATA CORRESPONDING TO THE TARGET SEMICONDUCTOR PRODUCT SUCH THAT THE TARGET PREDICTION DATA INDICATES THE CHARACTERISTICS OF THE SEMICONDUCTOR DEVICE INCLUDED IN A TARGET SEMICONDUCTOR PRODUCT — S300

END

| SP | PGC | PT | PG | PR | SR |
|---|---|---|---|---|---|
| SP1 | CB1 | PT1 | PG1 | PR1 | SR1 |
| SP2 | CB2 | PT1 | PG2 | PR2 | SR2 |
| SP3 | CB3 | PT1 | PG3 | PR3 | SR3 |
| SP4 | CB4 | PT2 | PG1 | PR4 | SR4 |
| SP5 | CB5 | PT2 | PG2 | PR5 | SR5 |
| SP6 | CB6 | PT2 | PG3 | PR6 | SR6 |
| SP7 | CB7 | PT3 | PG1 | PR7 | SR7 |
| SP8 | CB8 | PT3 | PG3 | PR8 | SR8 |
| SP9 | CB9 | PT3 | PG2 | PR9 | NONE |

ESP — SP4

TSP — SP9

FIG. 10

| INPUT DATA(X) | | OUTPUT DATA(Y) | |
|---|---|---|---|
| DEVICE DATA(DV) | PROCESS DATA(PR) | PREDICTION DATA(PD) | UNCERTAINTY DATA(UC) |
| W | $D_k$ | $V_t$ | $U_m$ |
| L | $D_d$ | G | $U_d$ |
| $T_{op}$ | $T_{act}$ | $V_{bk}$ | |
| $V_d$ | tOG | $I_d$ | |
| $V_g$ | tSP | | |
| $V_b$ | | | |
| $V_s$ | | | |

Figure 13:
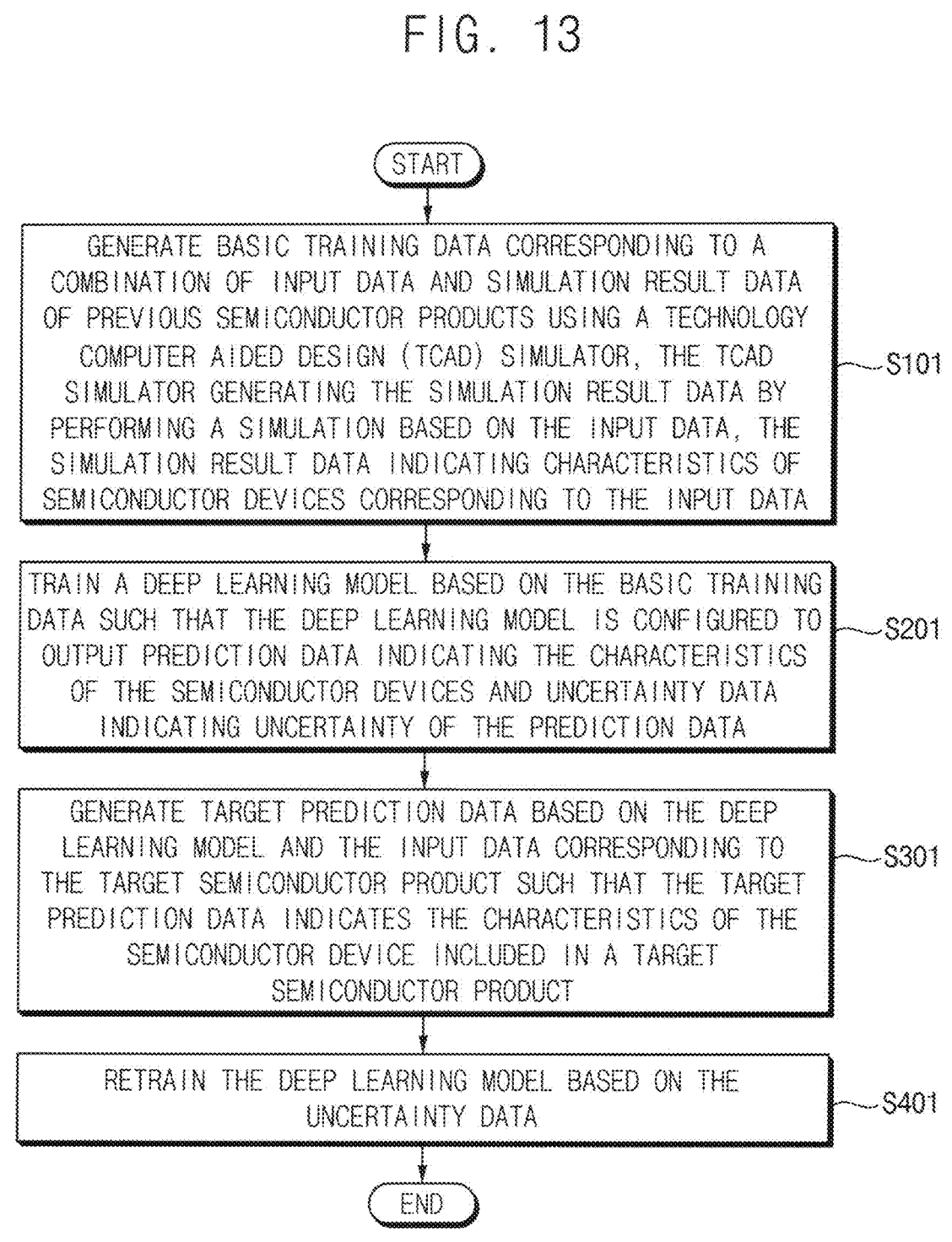

START

GENERATE BASIC TRAINING DATA CORRESPONDING TO A COMBINATION OF INPUT DATA AND SIMULATION RESULT DATA OF PREVIOUS SEMICONDUCTOR PRODUCTS USING A TECHNOLOGY COMPUTER AIDED DESIGN (TCAD) SIMULATOR, THE TCAD SIMULATOR GENERATING THE SIMULATION RESULT DATA BY PERFORMING A SIMULATION BASED ON THE INPUT DATA, THE SIMULATION RESULT DATA INDICATING CHARACTERISTICS OF SEMICONDUCTOR DEVICES CORRESPONDING TO THE INPUT DATA ~S101

TRAIN A DEEP LEARNING MODEL BASED ON THE BASIC TRAINING DATA SUCH THAT THE DEEP LEARNING MODEL IS CONFIGURED TO OUTPUT PREDICTION DATA INDICATING THE CHARACTERISTICS OF THE SEMICONDUCTOR DEVICES AND UNCERTAINTY DATA INDICATING UNCERTAINTY OF THE PREDICTION DATA ~S201

GENERATE TARGET PREDICTION DATA BASED ON THE DEEP LEARNING MODEL AND THE INPUT DATA CORRESPONDING TO THE TARGET SEMICONDUCTOR PRODUCT SUCH THAT THE TARGET PREDICTION DATA INDICATES THE CHARACTERISTICS OF THE SEMICONDUCTOR DEVICE INCLUDED IN A TARGET SEMICONDUCTOR PRODUCT ~S301

RETRAIN THE DEEP LEARNING MODEL BASED ON THE UNCERTAINTY DATA ~S401

END

START

COMPARE A MODEL UNCERTAINTY VALUE WITH A MODEL REFERENCE VALUE — S311

GENERATE ADDITION TRAINING DATA USING A TCAD SIMULATOR WHEN THE MODEL UNCERTAINTY VALUE IS LARGER THAN THE MODEL REFERENCE VALUE SUCH THAT ADDITION TRAINING DATA IS DIFFERENT FROM BASIC TRAINING DATA — S312

RETRAIN THE DEEP LEARNING MODEL BASED ON THE ADDITION TRAINING DATA — S313

END

METHOD OF PREDICTING CHARACTERISTIC OF SEMICONDUCTOR DEVICE AND COMPUTING DEVICE PERFORMING THE SAME

CROSS-REFERENCE TO RELATED APPLICATION

This U.S. non-provisional application claims priority under 35 USC § 119 to Korean Patent Application No. 10-2021-0135526, filed on Oct. 13, 2021, in the Korean Intellectual Property Office (KIPO), the disclosure of which is incorporated by reference herein in its entirety.

BACKGROUND

1. Technical Field

Example embodiments relate generally to semiconductor integrated circuits, and more particularly to a method of predicting characteristics of semiconductor device based on deep learning and a computing device performing the method.

2. Discussion of the Related Art

With development of the electronics industry, the design technology co-optimization (DTCO), in which the design of a semiconductor product is checked based on available manufacturing processes, is increasingly important. For example, in the foundry industry, a manufacturer may provide a device model corresponding to a target process level and a designer may design and simulate the semiconductor product using the device model. However, a change of the target process level may lead to a change of the device model. In these cases, the designer has to change the established design, and it may take an impractical and/or an enormous amount of time to newly perform a simulation based on the changed design, and accordingly, extra cost may be incurred to the manufacture and/or time loss may be incurred to the designer. Moreover, if the accuracy of a model performing the simulation is low, the performance of designed and manufactured product may be degraded due to inaccurate prediction of the characteristics of the semiconductor device.

SUMMARY

Some example embodiments may provide a method of predicting characteristics of semiconductor device based on deep learning and a computing device performing the method, capable of efficiently predicting characteristics of semiconductor devices.

According to some example embodiments, a method of predicting characteristics of a semiconductor device included in a target semiconductor product is performed by at least one processor executing program codes stored in computer readable media. The method includes generating basic training data corresponding to a combination of input data and simulation result data of previous semiconductor products, the basic training data generated using a technology computer aided design (TCAD) simulator, the simulation result data generated by performing a simulation based on the input data of the TCAD simulator such that the simulation result data indicate characteristics of semiconductor devices corresponding to the input data of the TCAD simulator; training a deep learning model based on the basic training data such that the deep learning model is configured to output prediction data indicating the characteristics of the semiconductor devices; and generating target prediction data based on the deep learning model and input data corresponding to the target semiconductor product such that the target prediction data indicates the characteristics of the semiconductor device included in the target semiconductor product.

According to some example embodiments, a method of predicting characteristics of a semiconductor device included in a target semiconductor product is performed by at least one processor executing program codes stored in computer readable media. The method includes generating basic training data corresponding to a combination of input data and simulation result data of previous semiconductor products generated by a technology computer aided design (TCAD) simulator, the simulation result data generated by performing a simulation based on the input data of the TCAD simulator such that the simulation result data indicate characteristics of semiconductor devices corresponding to the input data of the TCAD simulator; training a deep learning model based on the basic training data such that the deep learning model is configured to output prediction data indicating the characteristics of the semiconductor devices and uncertainty data indicating uncertainty of the prediction data; generating target prediction data based on the deep learning model and input data corresponding to the target semiconductor product such that the target prediction data indicates the characteristics of the semiconductor device included in the target semiconductor product; and retraining the deep learning model based on the uncertainty data.

According to example embodiments, a computing device includes at least one processor and a computer readable medium storing program codes and basic training data. The basic training data corresponds to a combination of input data and simulation result data of previous semiconductor products. The basic training data is generated by a technology computer aided design (TCAD) simulator, the simulation result data generated by performing a simulation based on the input data of the TCAD simulator. The simulation result data indicates characteristics of semiconductor devices corresponding to the input data of the TCAD simulator such that that the deep learning model is configured to output prediction data indicating the characteristics of semiconductor devices, and generate target prediction data based on the deep learning model and the input data corresponding to a target semiconductor product such that the target prediction data indicates the characteristics of the semiconductor device included in the target semiconductor product.

The method and the computing device according to some example embodiments may reliability and efficiently predict the characteristics of the semiconductor device included in the new semiconductor product, by generating the basic training data corresponding to the combinations of the input data and the simulation result data using the established technology computer aided design (TCAD) simulator with respect to the previous semiconductor products and training the deep learning model based on the basic training data.

In addition, the method and the computing device according to some example embodiments may provide the deep learning model configured to precisely predict the characteristics of the semiconductor device by training the deep learning model to output the prediction data indicating the characteristics of the semiconductor device and the uncertainty data indicating the uncertainty of the prediction data and retraining the deep learning model based on the uncertainty data.

Through the enhanced prediction performance of the deep learning model, the time and/or the cost of designing and/or manufacturing the semiconductor product including the semiconductor device and the performance of the semiconductor product may be enhanced.

BRIEF DESCRIPTION OF THE DRAWINGS

Example embodiments of the present disclosure will be more clearly understood from the following detailed description taken in conjunction with the accompanying drawings.

FIG. 1 is a flowchart illustrating a method of predicting characteristics of semiconductor device according to some example embodiments.

FIG. 2 is a block diagram illustrating a computing device according to some example embodiments.

FIGS. 4 and 5 are diagrams for describing examples of a deep learning neural network structure that is driven by a machine learning device according to some example embodiments.

FIGS. 7 and 8 are diagrams for describing relationship between previous semiconductor products and a target semiconductor product in a method of predicting characteristics of semiconductor device according to some example embodiments.

FIG. 10 is a diagram illustrating data in a method of predicting characteristics of semiconductor device according to some example embodiments.

FIG. 12 is a diagram illustrating root mean square error (RMSE) of simulation result data and prediction data.

FIG. 13 is a flowchart illustrating a method of predicting characteristics of semiconductor device according to some example embodiments.

DETAILED DESCRIPTION OF THE EMBODIMENTS

Figure 3:
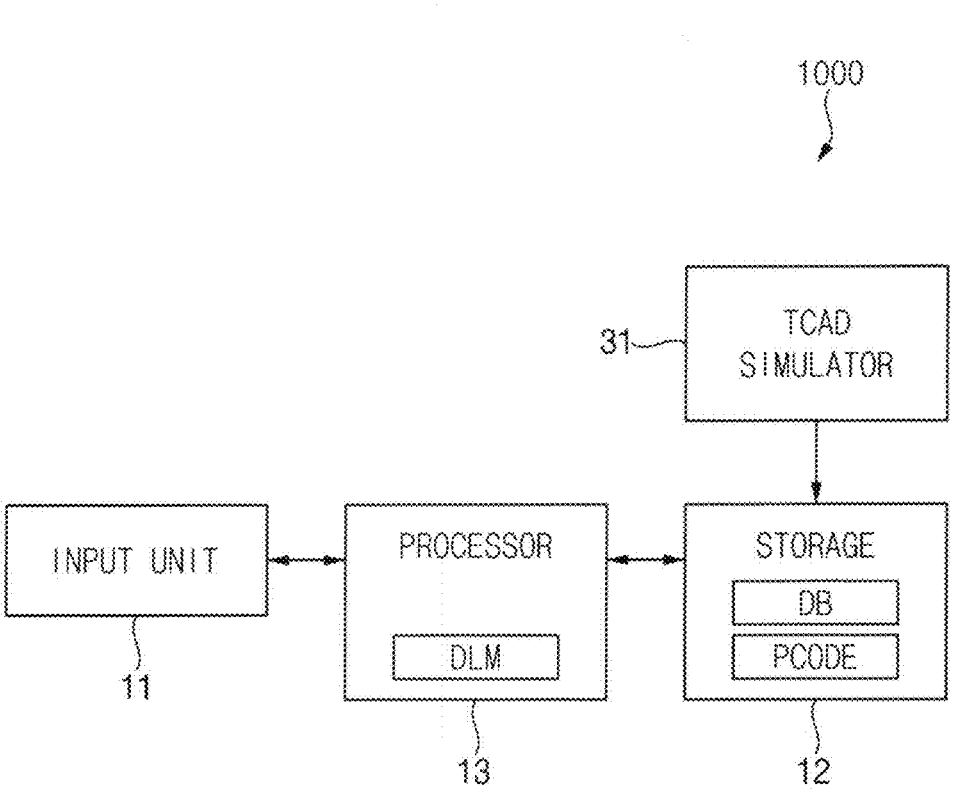
FIG. 3 is a block diagram electronic device according to some example embodiments.

Various example embodiments will be described more fully hereinafter with reference to the accompanying drawings, in which some example embodiments are shown. In the drawings, like numerals refer to like elements throughout. Therefore, the repeated descriptions of like element may be omitted.

FIG. 1 is a flowchart illustrating a method of predicting characteristics of a semiconductor device based on deep learning according to some example embodiments. At least a portion of the method may be performed by executing program codes by at least one processor. The program codes may be stored in computer readable media. The computer readable media may be, for example, a non-transistor computer readable media such as a volatile and/or a non-volatile memory. The term "non-transitory," as used herein, is a description of the medium itself (e.g., as tangible, and not a signal) as opposed to a limitation on data storage persistency (e.g., RAM vs. ROM).

Referring to FIG. 1, basic training data corresponding to a combination of input data and simulation result data of previous semiconductor products may be generated using a technology computer aided design (TCAD) simulator (S100).

As will be described below with reference to FIGS. 7 and 8, the basic training data may correspond to the previous semiconductor products. As will be described below with reference to FIG. 9, the TCAD simulator may generate the simulation result data by performing a simulation based on the input data such that the simulation result data may indicate characteristics of semiconductor devices corresponding to the input data. As will be described below with reference to FIG. 10, the input data may include device data and process data. The device data may indicate, e.g., structure and operation condition of the semiconductor device and the process data may indicate, e.g., condition of manufacturing process of the semiconductor device.

A deep learning model may be trained based on the basic training data such that the deep learning model is configured to output prediction data indicating the characteristics of the semiconductor devices (S200). As will be described below with reference to FIGS. 9 and 10, the simulation result data and the prediction data may indicate electrical characteristics of the semiconductor device.

Target prediction data may be generated based on the deep learning model and the input data corresponding to the target semiconductor product such that the target prediction data may indicate the characteristics of the semiconductor device included in the target semiconductor product (S300). The target prediction data may be used to simulate and/or predict the performance of a semiconductor device, e.g., before the semiconductor device is manufactured. For example, the target prediction data may be used to determine whether a change to the design of the semiconductor device may improve or deteriorate the performance of the semiconductor device based on, e.g., operational conditions for the semiconductor device. In some example embodiments, for example, target prediction data (and/or the deep learning model) may be used to confirm a design based on these predictions thereby indicating that the design is okay to proceed to manufacture (and/or forwarding the design to a processor controlling the semiconductor manufacturing equipment), and/or may pause (and/or stop) the production of semiconductor devices based on the design if, e.g., a change in the design would result in a characteristic of the semiconductor devices deteriorating below an acceptable threshold value.

In some example embodiments, the target prediction data of the deep learning model may (e.g., periodically) be compared to a semiconductor device manufactured based on the design to confirm the accuracy of the deep learning model. In some example embodiments, if the prediction and the manufactured semiconductor device differ, e.g., beyond a maximum acceptable threshold, the deep learning model may be, e.g., updated (e.g., trained and/or re-trained) based on the actually manufactured semiconductor device and/or devices and/or on uncertainty data as discussed in further detail below.

As will be described below with reference to FIGS. 7 and 8, the target semiconductor product may be a new semiconductor product that is not included in the previous semiconductor products.

As such, the method and the computing device according to some example embodiments may efficiently predict the characteristics of the semiconductor device included in the new semiconductor product, by generating the basic training data corresponding to the combinations of the input data and the simulation result data using the established TCAD simulator with respect to the previous semiconductor products and training the deep learning model based on the basic training data. Through the enhanced prediction performance of the deep learning model, the time and/or the cost of designing and/or manufacturing the semiconductor product including the semiconductor device, and the performance of the semiconductor product may be enhanced.

Figure 2:
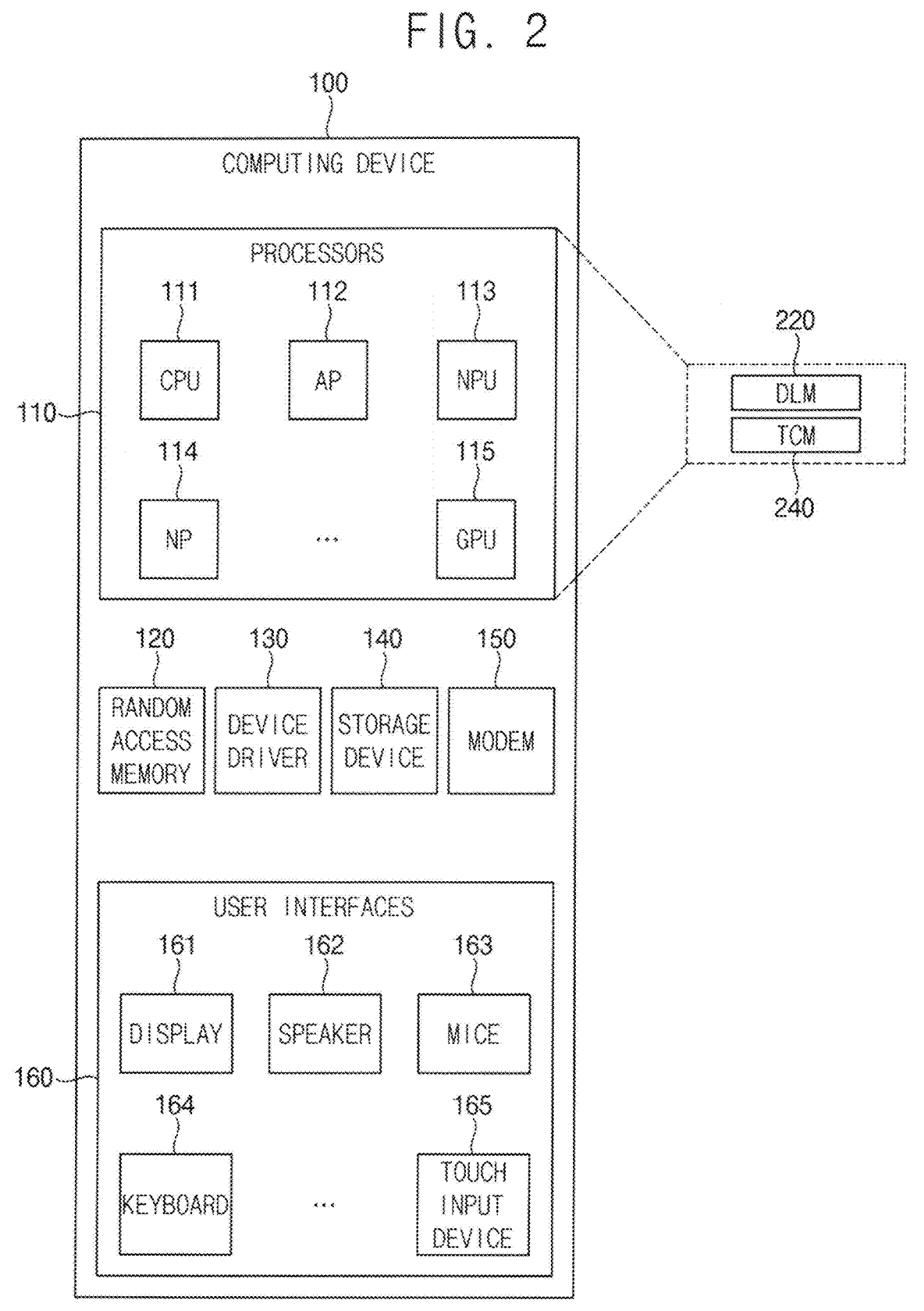

FIG. 2 is a block diagram illustrating a computing device according to some example embodiments.

Referring to FIG. 2, a computing device 100 may include processors 110, a random access memory 120, a device driver 130, a storage device 140, a modem 150, and a user interface 160.

At least one processor of the processors 110 may be configured to operate a deep learning module DLM 220 and a training control module TCM 240. The training control module 240 may perform the method of FIG. 1 to train the deep learning model 220.

In some example embodiments, the deep learning model 220 and the correction module 240 may be implemented as instructions (and/or program codes) that may be executed by the at least one of the processors 110. The instructions (and/or program codes) of the deep learning model 220 and the training control module 240 may be stored in computer readable media. For example, the at least one processor may load (and/or read) the instructions to (and/or from) the random access memory 120 and/or the storage device 140.

In some example embodiments, the at least one processor may be manufactured to efficiently execute instructions included in the deep learning model 220 and the training control module 240. For example, the at least one processor may be a dedicated processor that is implemented (e.g. in hardware) based on the deep learning model 220 and the training control module 240. The at least one processor may efficiently execute instructions from various machine learning modules. In some example embodiments, at least one processor may receive information corresponding to the deep learning model 220 and the training control module 240 to operate the deep learning model 220 and the training control module 240.

The processors 110 may include, for example, at least one general-purpose processor such as a central processing unit (CPU) 111, an application processor (AP) 112, and/or other processing units. In addition, the processors 110 may include at least one special-purpose processor such as a neural processing unit (NPU) 113, a neuromorphic processor (NP) 114, a graphic processing unit (GPU 115), etc. For example, the processors 110 may include two or more heterogeneous processors. Though illustrated as including the CPU 111, AP 112, NPU 113, NP 114, and GPU 115, the example embodiments are not so limited. For example, the processors 110 may include more or fewer processors than illustrated.

The random access memory 120 may be used as an operation memory of the processors 110, a main memory, and/or a system memory of the computing device 100. The random access memory 120 may include a volatile memory such as a dynamic random access memory (DRAM), a static random access memory (SRAM), and/or the like. Additionally (and/or alternatively), the random access memory 120 may include a nonvolatile memory such as a phase-change random access memory (PRAM), a ferroelectrics random access memory (FRAM), a magnetic random access memory (MRAM), a resistive random access memory (RRAM), and/or the like.

The device driver 130 may control peripheral circuits such as the storage device 140, the modem 150, the user interface 160, etc., according to requests of the processors 110. The storage device 140 may include a fixed storage device such as a hard disk drive, a solid state drive (SSD), etc., and/or include (and/or be connected to) an attachable storage device such as an external hard disk drive, an external SSD, a memory card, and/or other external storage.

The modem 150 may perform wired and/or wireless communication with external devices through various communication methods and/or communication interface protocols such as Ethernet, Wi-Fi, LTE, a third generation communication system such as code division multiple access (CDMA), global system for mobile communications (GSM), north American digital cellular (NADC), extended-time division multiple access (E-TDMA), and/or wide band code division multiple access (WCDMA), a fourth generation communication system such as 4G LTE, a fifth generation communication system such as 5G mobile communication, and/or other communication methods.

The user interface 160 may receive information from a user and provide information to the user. The user interface 160 may include at least one output interface such as a display 161, a speaker 162, etc., and may further include at least one input interface such as mice (mouse) 163, a keyboard 164, a touch input device 165, etc. Though illustrated as including the display 161, the speaker 162, the mouse, 163, the keyboard 164, and the touch input device 165, the example embodiments are not so limited, and may, e.g., include more or fewer elements. In some example embodiments, for example, some of the user interfaces 160 may be combined (e.g., to include a touch screen display, and/or the like).

In some example embodiments, the deep learning model 220 and the training control module 240 may receive the instructions (and/or codes) through the modem 150 and store the instructions in the storage device 150. In some example embodiments, the instructions of the deep learning model 220 and the training control module 240 may be stored in an attachable storage device and the attachable storage device may be connected to the computing device 100 by a user. The instructions of the deep learning model 220 and the training control module 240 may be loaded in the random access memory 120 for rapid execution of the instructions.

In some example embodiments, at least one of the computer program codes, the deep learning model and/or the training control module may be stored in a transitory and/or non-transitory computer-readable medium. In some example embodiments, values resulting from a simulation performed by the processor and/or values obtained from arithmetic processing performed by the processor may be stored in a transitory and/or non-transitory computer-readable medium. In some example embodiments, intermediate values generated during deep learning may be stored in a transitory and/or non-transitory computer-readable medium. In some example embodiments, at least one of the training data, the process data, the device data, the simulation result data, the prediction data, and/or the uncertainty data may be stored in a transitory or non-transitory computer-readable medium. However, the example embodiments are not limited thereto.

FIG. 3 is a block diagram electronic device according to some example embodiments.

Referring to FIG. 3, an electronic device 1000 may include an input unit 11, a storage 12, and a processor 13.

The storage 12 may store program codes PCODE, a database DB, etc. The database DB may include the basic training data with respect to the previous semiconductor products. A TCAD simulator 31 may perform a simulation based on input data and generate simulation result data indicating characteristics of semiconductor devices corresponding to the input data. As will be described below with reference to FIG. 10, the input data may include device data and process data. The device data may indicate, e.g., structure and operation condition of the semiconductor device and the process data may indicate, e.g., condition of manufacturing process of the semiconductor device.

The database DB may include a plurality of basic training data corresponding to different combinations of the process data, the device data, and the simulation result data. The establishment of the database DB may be performed by an external processor and/or by the processor 13 that trains the deep learning model DLM.

The program codes PCODE may be executed by the processor 13 to implement the deep learning model 220 and the training control module 240 in FIG. 2. As such, the deep learning model 220 and the training control module 240 may be stored in the storage 12, which is a computer readable medium. The processor 13 may load the program codes PCODE to, e.g., the random access memory 120 in FIG. 2.

The processor 13 may train the deep learning model DLM based on the program codes PCODE and the basic training data in the database DB.

The input unit 11 may receive the input data of the target semiconductor product and provide the input data to the processor 13. After training of the deep learning model DLM is completed, the processor 13 may apply the input data to the trained deep learning model DLM to generate prediction data indicating the characteristics of the semiconductor device included in the target semiconductor product. For example, as noted above, the processor 13 may determine whether a change to the design of the semiconductor device may improve or deteriorate the performance of the semiconductor device, and, in some example embodiments, may confirm or reject a design based on these predictions.

Figure 4:
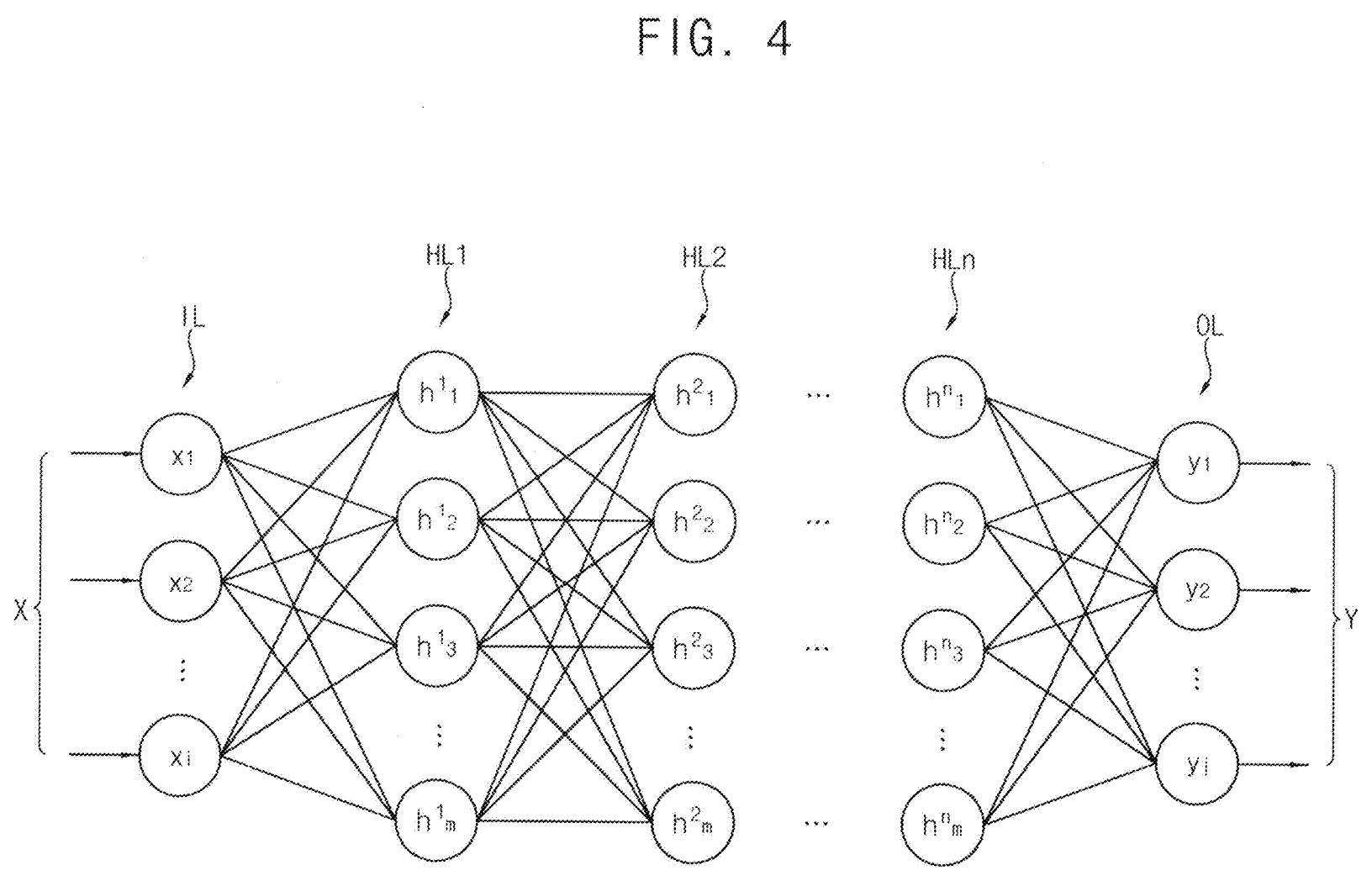
Figure 5:
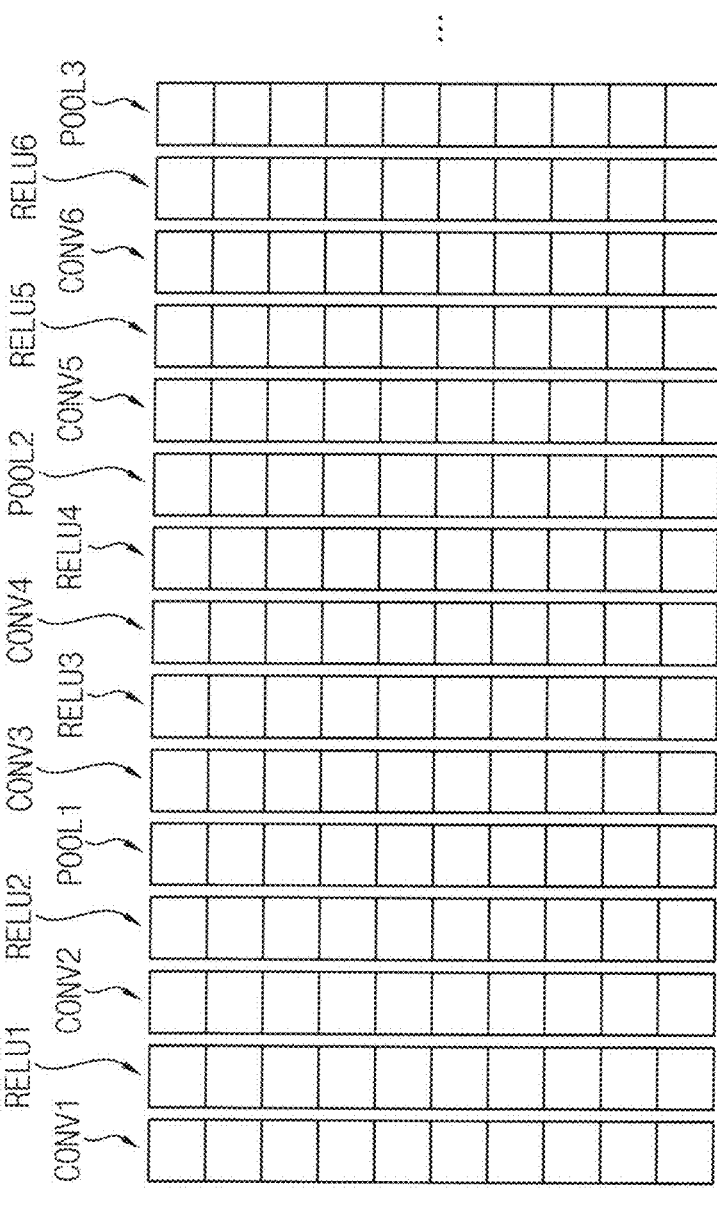

FIGS. 4 and 5 are diagrams for describing examples of a deep learning neural network structure that is driven by a machine learning device according to some example embodiments.

Referring to FIG. 4, a general neural network may include an input layer IL, a plurality of hidden layers HL1, HL2, . . . , HLn and an output layer OL.

The input layer IL may include i input nodes x1, x2, . . . , xi, where i is a natural number. Input data (e.g., vector input data) X whose length is i may be input to the input nodes x1, x2, . . . , xi such that each element of the input data X is input to a respective one of the input nodes x1, x2, . . . , xi.

The plurality of hidden layers HL1, HL2, . . . , HLn may include n hidden layers, where n is a natural number, and may include a plurality of hidden nodes $h^1_1$, $h^1_2$, $h^1_3$, . . . , $h^1_m$, $h^2_1$, $h^2_2$, $h^2_3$, . . . , $h^2_m$, $h''_1$, $h''_2$, $h''_3$, . . . , $h''_m$. For example, the hidden layer HL1 may include m hidden nodes $h^1_1$, $h^1_2$, $h^1_3$, . . . , $h^1_m$, the hidden layer HL2 may include m hidden nodes $h^2_1$, $h^2_2$, $h^2_3$, . . . , $h^2_m$, and the hidden layer HLn may include m hidden nodes $h''_1$, $h''_2$, $h''_3$, . . . , $h''_m$, where m is a natural number.

The output layer OL may include j output nodes y1, y2, . . . , yj, providing output data Y where j is a natural number. The output layer OL may output the output data Y associated with the input data X.

A structure of the neural network illustrated in FIG. 4 may be represented by information on branches (and/or connections) between nodes illustrated as lines, and a weighted value assigned to each branch. Nodes within one layer may not be connected to one another, but nodes of different layers may be fully (and/or partially) connected to one another.

Each node (e.g., the node $h^1_1$) may receive an output of a previous node (e.g., the node xi), may perform a computing operation, computation and/or calculation on the received output, and may output a result of the computing operation, computation, or calculation as an output to a next node (e.g., the node $h^2_1$). Each node may calculate a value to be output by applying the input to a specific function, e.g., a nonlinear function.

Generally, the structure of the neural network may be set in advance, and the weighted values for the connections between the nodes are set appropriately using data having an already known answer of which class the data belongs to. The data with the already known answer may be referred to as "training data," and a process of determining the weighted value may be referred to as "training." The neural network "learns" during the training process. A group of an independently trainable structure and the weighted value is referred to as a "model," and a process of predicting, by the model with the determined weighted value, which class the input data belongs to, and then outputting the predicted value, is referred to as a "testing" process.

The general neural network illustrated in FIG. 4 may not be suitable for handling input image data (or input sound data) because each node (e.g., the node $h^1_1$) is connected to all nodes of a previous layer (e.g., the nodes x1, x2, . . . , xi included in the layer IL) and then the number of weighted values drastically increases as the size of the input image data increases. Thus, a convolutional neural network ("CNN"), which is implemented by combining the filtering technique with the general neural network, has been researched such that two-dimensional image (e.g., the input image data) is efficiently trained by the convolutional neural network.

Referring to FIG. 5, a convolutional neural network (CNN) may include a plurality of layers CONV1, RELU1, CONV2, RELU2, POOL1, CONV3, RELU3, CONV4, RELU4, POOL2, CONV5, RELU5, CONV6, RELU6, POOL3, and FC.

Unlike the general neural network, each layer of the convolutional neural network may have three dimensions of width, height, and depth, and thus data that is input to each layer may be volume data having three dimensions of width, height, and depth.

Each of convolutional layers CONV1, CONV2, CONV3, CONV4, CONV5, and CONV6 may perform a convolutional operation on input volume data. For example, in an image processing, the convolutional operation represents an operation in which image data is processed based on a mask with weighted values and an output value is obtained by multiplying input values by the weighted values and adding up the total multiplied values. The mask may be referred to as a filter, window, and/or kernel.

In further detail, parameters of each convolutional layer may comprise (and/or include) a set of learnable filters. Every filter may be spatially small (e.g., along width and height), but may extend through the full depth of an input volume. For example, during the forward pass, each filter may be slid (e.g., convolved) across the width and height of the input volume, and dot products may be computed between the entries of the filter and the input at any position. As the filter is slid over the width and height of the input volume, a two-dimensional activation map that gives the responses of that filter at every spatial position may be generated. As a result, an output volume may be generated by stacking these activation maps along the depth dimension. For example, if input volume data having a size of 32×32×3 passes through the convolutional layer CONV1 having four filters with zero-padding, output volume data of the convolutional layer CONV1 may have a size of 32×32x12 (e.g., a depth of volume data increases).

Each of the rectifying linear unit (RELU) layers RELU1, RELU2, RELU3, RELU4, RELU5, and RELU6 may perform a rectified linear unit operation that corresponds to an activation function defined by, e.g., a function $f(x)=\max(0, x)$ (e.g., an output is zero for all negative input x). For example, if input volume data having a size of 32×32x12 passes through the RELU layer RELU1 to perform the rectified linear unit operation, output volume data of the RELU layer RELU1 may have a size of 32×32x12 (e.g., a size of volume data is maintained).

Each of pooling layers POOL1, POOL2, and POOL3 may perform a down-sampling operation on input volume data along spatial dimensions of width and height. For example, four input values arranged in a 2×2 matrix formation may be converted into one output value based on a 2×2 filter. For example, a maximum value of four input values arranged in a 2×2 matrix formation may be selected based on 2×2 maximum pooling, or an average value of four input values arranged in a 2×2 matrix formation may be obtained based on 2×2 average pooling. For example, if input volume data having a size of 32×32×12 passes through the pooling layer POOL1 having a 2×2 filter, output volume data of the pooling layer POOL1 may have a size of 16×16×12 (e.g., width and height of volume data decreases, and a depth of volume data is maintained).

Typically, one convolutional layer (e.g., CONV1) and one RELU layer (e.g., RELU1) may form a pair of CONV/RELU layers in the convolutional neural network, pairs of the CONV/RELU layers may be repeatedly arranged in the convolutional neural network, and the pooling layer may be periodically inserted in the convolutional neural network, thereby reducing characteristics of the input data X. The type and number of layers including in the convolution neural network may be changed variously.

Example embodiments of the deep learning model are not limited to a specific neural network. The deep learning model may include, for example, at least one of PNN (Perceptron Neural Network), CNN (Convolution Neural Network), R-CNN (Region with Convolution Neural Network), RPN (Region Proposal Network), RNN (Recurrent Neural Network), S-DNN (Stacking-based deep Neural Network), S-SDNN (State-Space Dynamic Neural Network), Deconvolution Network, DBN (Deep Belief Network), RBM (Restricted Boltzmann Machine), Fully Convolutional Network, LSTM (Long Short-Term Memory) Network, Classification Network, BNN (Bayesian Neural Network), and/or the like. Additionally (and/or alternatively), the deep learning model(s) may be trained based on at least one of various algorithms such as regression, linear and/or logistic regression, random forest, a support vector machine (SVM), and/or other types of models, such as statistical clustering, Bayesian classification, decision trees, dimensionality reduction such as principal component analysis, expert systems, and/or combinations thereof including ensembles such as random forests.

Figure 6:
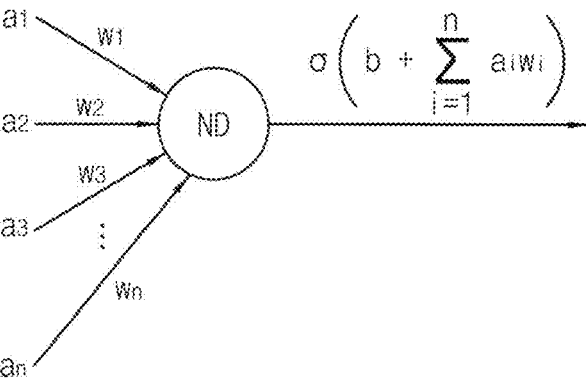
FIG. 6 is a diagram illustrating an example of a node included in a neural network.

FIG. 6 is a diagram illustrating an example of a node included in a neural network.

FIG. 6 illustrates an example node operation performed by a node ND in a neural network. When N inputs a1~an are provided to the node ND, the node ND may multiply the n inputs a1~an and corresponding n weights w1~wn, respectively, may sum n values obtained by the multiplication, may add an offset "b" to a summed value, and may generate one output value by applying a value to which the offset "b" is added to a specific function "a". The learning operation may be performed based on the training data to update all nodes in the neural network.

In cases of predicting characteristics of a semiconductor device based on deep learning, a sufficient amount of training data and/or learning data may be utilized in (and/or required for) training of a deep learning model (and/or deep learning module). For example, tens through millions of training data of various kinds may be utilized (and/or required) to prevent over-fitting during training and enhance performance of the deep learning model. According to some example embodiments, the database for training the deep learning model may be established efficiently by generating the training data using the TCAD simulator.

Figure 7:
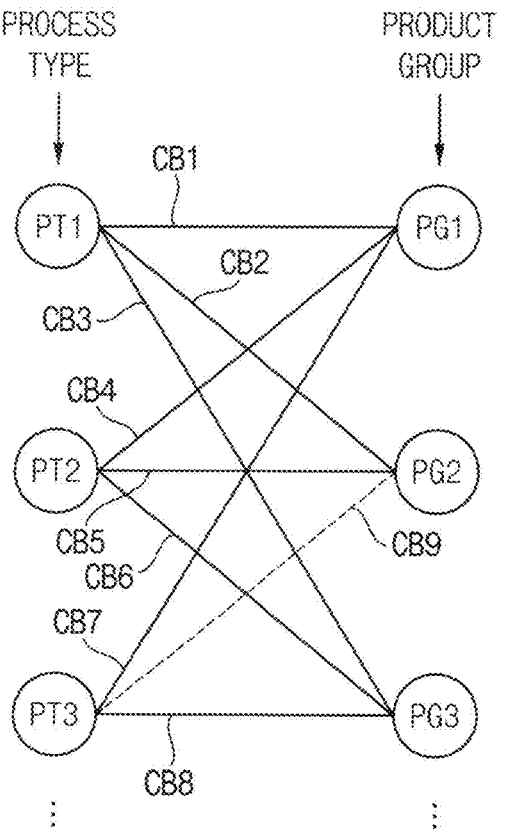

FIGS. 7 and 8 are diagrams for describing relationship between previous semiconductor products and a target semiconductor product in a method of predicting characteristics of semiconductor device according to some example embodiments.

Referring to FIGS. 7 and 8, the process data PT may be determined depending on a process-group combination PGC of a process type PT indicating a manufacturing process of each semiconductor product SP and a product group PG in which each semiconductor product SP is included. For example, the process type PT may indicate a critical dimension ("CD") of the manufacturing process. The product group PG may include a server product group, a mobile product group, a graphic product group, a high bandwidth memory product group, and/or on the like.

A first semiconductor product SP1 may correspond to a first process-product combination CB1 of a first process type PT1 and a first product group PG1, and the process data PR of the first semiconductor product SP1 may be determined as first process data PR1. A second semiconductor product SP2 may correspond to a second process-product combination CB2 of the first process type PT1 and a second product group PG2, and the process data PR of the second semiconductor product SP2 may be determined as second process data PR2. A third semiconductor product SP3 may correspond to a third process-product combination CB3 of the first process type PT1 and a third product group PG3, and the process data PR of the third semiconductor product SP3 may be determined as third process data PR3.

A fourth semiconductor product SP4 may correspond to a fourth process-product combination CB4 of a second process type PT2 and the first product group PG1, and the process data PR of the fourth semiconductor product SP4 may be determined as fourth process data PR4. A fifth semiconductor product SP5 may correspond to a fifth process-product combination CB5 of the second process type PT2 and the second product group PG2, and the process data PR of the fifth semiconductor product SP5 may be determined as fifth process data PR5. A sixth semiconductor product SP6 may correspond to a sixth process-product combination CB6 of the second process type PT2 and the third product group PG3, and the process data PR of the sixth semiconductor product SP6 may be determined as sixth process data PR6.

A seventh semiconductor product SP7 may correspond to a seventh process-product combination CB7 of a third process type PT3 and the first product group PG1, and the process data PR of the seventh semiconductor product SP7 may be determined as seventh process data PR7. An eighth semiconductor product SP8 may correspond to an eighth process-product combination CB8 of the third process type PT3 and the third product group PG3, and the process data PR of the eighth semiconductor product SP8 may be determined as eighth process data PR8.

First through eighth simulation result data SR1~SR8 may be generated with respect to the first through eighth semiconductor products SP1~SP8 using the TCAD simulator as described with reference to FIG. 3. The basic training data may be generated using the first through eighth simulation result data SR1~SR8. The first through eighth semiconductor products SP1~SP8 may be the previous or established semiconductor products ESP as described with reference to FIG. 1.

A ninth semiconductor product SP9 may correspond to a ninth process-product combination CB9 of the third process type PT3 and the second product group PG2, and the process data PR of the ninth semiconductor product SP9 may be determined as ninth process data PR9.

The ninth semiconductor product SP9 may be in a stage of designing in which the simulation result data corresponding to the ninth semiconductor product SP9 is not generated yet, whereas the first through eighth semiconductor products SP1~SP8 have the corresponding simulation result data. In other words, the ninth semiconductor product SP9 may be the target semiconductor product TSP as described with reference to FIG. 1.

As such, the process data PT may be determined depending on the process-group combination PGC of the process type PT indicating the manufacturing process of each semiconductor product SP and the product group PG in which each semiconductor product SP is included, and the process-group combination (e.g., the ninth process-group combination CB9) of the target semiconductor product (e.g., the ninth semiconductor product SP9) may be a new process-group combination that is not included in the process-group combinations (e.g., the first through eighth process-group combinations CB1~CB8) of the plurality of previous semiconductor products (e.g., the first through eight semiconductor products SP1~SP8). For example, the target semiconductor product (e.g., the ninth semiconductor product SP9) may be a new semiconductor product that is not included in the plurality of previous semiconductor products (e.g., the first through eighth semiconductor products SP1~SP8) respectively corresponding to the first through eighth simulation result data SR1~SR8. Though the example of FIG. 8 is illustrated as including nine semiconductor products (SP1~SP9), the example embodiments are not limited thereto. For example, some example embodiments may include more or fewer semiconductor products in the established semiconductor products ESP and/or more or fewer combinations.

The compact models, which are used with (and/or in replacement of) the TCAD simulator, are configured to provide the characteristics of semiconductor device within the range of the device data required for designing. For example, the test element groups may be related to the disposition of scribe lanes of a wafer to provide the measurement data for generating the compact models. However, the example embodiments are not limited thereto, and may include, for example, data related to an increase in time and/or difficulty in securing coverage of data range to generate the compact models, due to, e.g., a limited area for the scribe lanes, process turn-around-time (TAT), and/or the like.

According to some example embodiments, the characteristics of the semiconductor device included in the target semiconductor product (e.g., the ninth semiconductor product SP9) may be provided efficiently and rapidly by providing the database of the basic training data for training the deep learning model using the established simulation result data (e.g., the first through eight simulation result data SR1~SR8) of the previously developed semiconductor products (e.g., the first through eighth semiconductor products SP1~SP8) with the process data and the device data as the input of the deep learning model.

The plurality of previous semiconductor products and the target semiconductor product may be, e.g., memory devices. Some example embodiments are particularly useful in predicting the characteristics of the memory devices. In the memory business, the design technology co-optimization (DTCO) becomes more significant, e.g., providing device models rapidly for designing memory devices of next generations. In addition, the identical and/or similar semiconductor devices of the previous generation are used as the shrunken form in the next generation with respect to the memory devices, and thus the database for a new memory device may be efficiently established using the simulation result data of the previous memory devices by the TCAD simulator.

Figure 9:
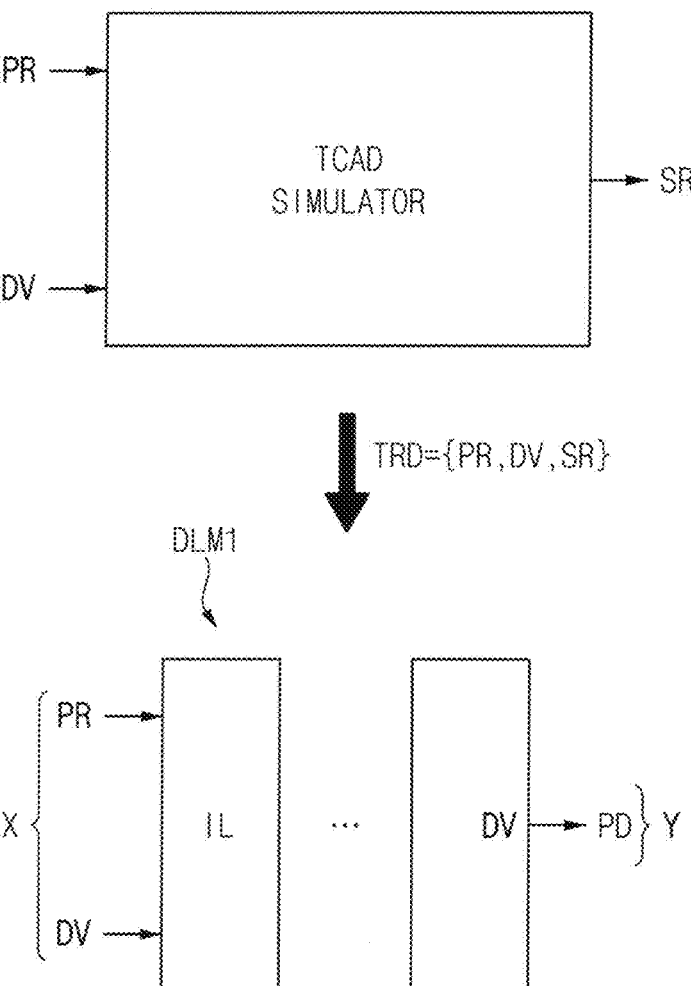
FIG. 9 is a diagram illustrating an example of a deep learning model in a method of predicting characteristics of semiconductor device according to some example embodiments.

FIG. 9 is a diagram illustrating an example of a deep learning model in a method of predicting characteristics of semiconductor device according to some example embodiments. For convenience of illustration, detailed configuration of a deep learning model is omitted and only an input layer IL receiving input data X and an output layer OL providing output data Y are illustrated in FIG. 9.

Semiconductor shape modeling may be performed based on the designed semiconductor layout. Semiconductor shape modeling may be performed using, for example, Technology Computer Aided Design (TCAD). In semiconductor shape modeling, process TCAD modeling a manufacturing process of a semiconductor device may be used, but the example embodiments described herein are not limited thereto. In some example embodiments, device TCAD modeling an operation of a semiconductor device may also be used alone and/or in combination. A TCAD tool for performing TCAD may be, for example, Synopsys, Silvaco, Crosslight, Cogenda SoftwarelVisualTCAD, Global TCAD Solutions, and/or Tiberlab.

Semiconductor shape modeling may be performed through simulation of a production process and/or processes (e.g., a physical thin film deposition operation and simulation of an etching operation) based on a semiconductor layout, to implement a modeled semiconductor shape. Here, a semiconductor shape is a concept encompassing a structure (for example, the arrangement of components of a semiconductor device), numerical values of the components of the semiconductor device (for example, a thickness of a thin film, a depth of a portion removed by an etching operation, physical properties of materials included, etc.), and/or the like. The semiconductor shape may also be referred to as a target spec. The numerical values of the components do not only refer to fixed constants but may also indicate process variables that may be selected and/or modified during, e.g., the simulation of a physical thin film deposition operation and/or the simulation of an etching operation.

A plurality of samples may be extracted by combining process variables used in simulation of a physical thin film deposition operation and simulation of an etching operation with respect to a modeled semiconductor shape implemented through semiconductor shape modeling. For example, a plurality of samples may be extracted through an independent linear combination of process variables used in simulation of a physical thin film deposition operation and simulation of an etching operation. For example, a plurality of samples may be extracted through Latin Hypercube Sampling (LHS).

A plurality of samples may be extracted by combining process variables used in simulation of some selected process steps, instead of combining process variables used in simulation of all process steps. Process steps and process variables selected to extract a plurality of samples may be process steps and/or process variables that are dominant in determining a semiconductor shape. In some example embodiments, process steps selected to extract a plurality of samples may include a thin film deposition operation of forming material layers that form components of a completed semiconductor device, an etching operation of removing a portion of the formed material layers, and/or a chemical mechanical polishing (CMP) process. Process variables may include a deposition time of a thin film deposition operation, a thickness of a thin film formed as a result of the thin film deposition operation, an etching time of an etching operation, etching thickness which is a result of the etching operation, a process time of a CMP process, a thickness of a removed portion or a thickness of a remaining portion, which may be a result of the CMP process, and/or the likes.

The extracted plurality of samples may be a plurality of modeled semiconductor shapes that are implemented through semiconductor shape modeling with respect to other process variables. For example, the extracted plurality of samples may be a plurality of modeled semiconductor shapes implemented through semiconductor shape modeling performed by varying a thickness of a thin film, a deposition time of the thin film, an etching depth, an etching time, and/or the like.

With respect to the modeled semiconductor shape, the TCAD simulator may perform a simulation based on the device data indicating the structure and the operation condition of the semiconductor device and generate the simulation result data indicating the characteristics of the semiconductor device corresponding to the process data and the device data.

Conventionally, the device characteristics are predicted using the TCAD simulator and engineers developed the device model by calibrating the predicted result. However, respective databases have to be established with respect to each product and each product generation and thus the turn-around-time (TAT) for developing device models may be delayed and/or increased significantly. In general, predicting using the TCAD simulator has been a bottleneck of developing device models.

According to some example embodiments, a combined database may be established based on the accumulated simulation result data of the previous semiconductor products and the TCAD simulator may be substituted with a deep learning model based on the combined database. The turn-around time for developing a new semiconductor product may be reduced significantly using the deep learning model substituting the TCAD simulator.

Referring to FIG. 9, a deep learning model DLM1 may be generated, which may replace a TCAD simulator. The basic training data TRD may be generated based on the simulation result data SR corresponding to the process data PR and the device data DV such that basic training data TRD correspond to a combination of the process data PR, the device data DV, and simulation result data SR. A plurality of basic training data TRD corresponding to different combinations may be generated based on different values of the process data PR and the device data DV.

In the example of FIG. 9, the input data X of the deep learning model DLM1 may include both of the process data PR1 and the device data DV. The output data Y may include the prediction data PD indicating the predicted characteristics of the semiconductor device. The supervised learning of the deep learning model DLM1 may be performed using the simulation result data SR as the ground-truth data with respect to the process data PR and the device data DV.

FIG. 10 is a diagram illustrating data in a method of predicting characteristics of semiconductor device according to some example embodiments. For clarity of illustration, FIG. 10 illustrates example data when a semiconductor device corresponds to a transistor. However, the example embodiments are not limited to a transistor and may be applied to semiconductor devices (e.g., two-terminal devices like diodes, three-terminal devices like rectifiers, four-terminal devices like optocouplers, electronic components of other types mimicking and/or coupled to semiconductor devices (e.g., microelectromechanical systems (MEMS), resistors, capacitors, integrated cells, etc.), and/or the like).

Referring to FIG. 10, input data X of a deep learning model may include both of device data DV and process data PR. As described with reference to FIG. 9, the input data X may include both of the device data DV and the process data PR.

The device data DV may indicate structure and operation condition of the semiconductor device. For example, the device data DV may include information on the structure of the semiconductor device such as a width W of a transistor, a length L of the transistor, and/or the like. In addition, the device data DV may include information of the operation condition of the semiconductor device such as an operation temperature Top of the transistor, a drain voltage Vd, a gate voltage Vg, a body voltage Vb, a source voltage Vs of the transistor, and/or the like.

The process data PR may indicate condition of manufacturing process of the semiconductor device. For example, the process data PR may include a kind Dk of a dopant in an ion-implanting process, a density Dd of the dopant, an activation temperature Tact, a thickness tOG of a gate oxide layer, a thickness of a spacer tSP in a gate structure of the transistor, and/or the like.

Output data Y of the deep learning model may include prediction data PD (e.g., as illustrated in FIG. 9). In some example embodiments, as will be described below with reference to FIG. 15, the output data Y of the deep learning model may include uncertainty data UC in addition to the prediction data PD.

The prediction data PD may indicate electrical characteristics of the semiconductor device. For example, the prediction data PD may include a threshold voltage Vt, a gain G, a breakdown voltage Vbk, a drain current Id of the transistor, and/or the like.

The uncertainty data UC may indicate uncertainty of the prediction data PD. The uncertainty data UC may include a model uncertainty value Um and/or a data uncertainty value Ud. As will be described below, the model uncertainty value Um may indicate the uncertainty of the prediction data PD caused by insufficiency of the basic training data, and the data uncertainty value Ud may indicate the uncertainty of the prediction data PD caused by noises of the basic training data.

Figure 11:
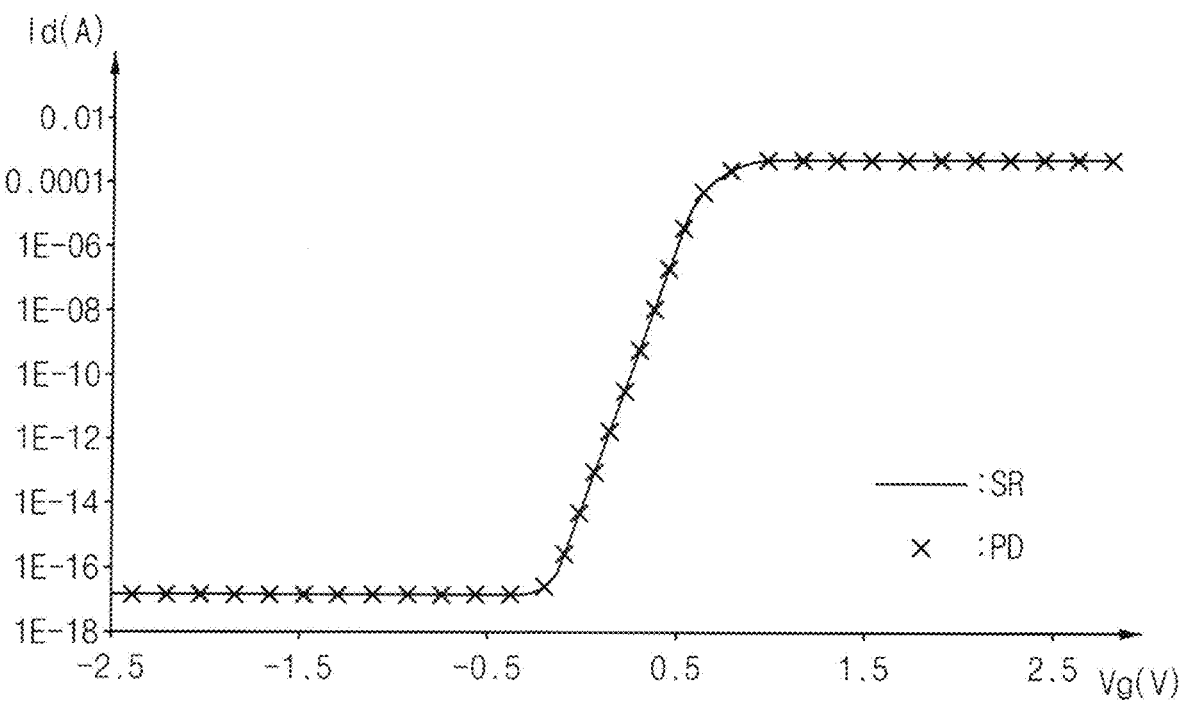
FIG. 11 is a diagram illustrating an example of simulation result data of a technology computer aided design (TCAD) simulator and prediction data of a trained deep learning model.

FIG. 11 is a diagram illustrating an example of a simulation result data of a technology computer aided design (TCAD) simulator and prediction data of a trained deep learning model.

FIG. 11 illustrates, when the semiconductor device corresponds to a transistor, the drain current Id in ampere (A) of the transistor according to the gate voltage Vg in volt (V) of the transistor. Among values of input data, the other values except the value of the gate voltage Vg are fixed. The drain current corresponds to one of the characteristics of the transistor.

As the deep learning model is trained, the prediction data PD output from the deep learning model may approach the simulation result data SR output from the TCAD simulator. The training of the deep learning model may include an iterative process, and the training completion of the deep learning model may be determined based on a difference between the simulation result data SR of the TCAD simulator and the prediction data PD of the deep learning model. For example, when it is determined that the prediction data PD has converged on the simulation result data SR sufficiently, training of the deep learning model may be stopped and the trained deep learning model may be provided for designing and manufacturing a new semiconductor product.

Figure 12:
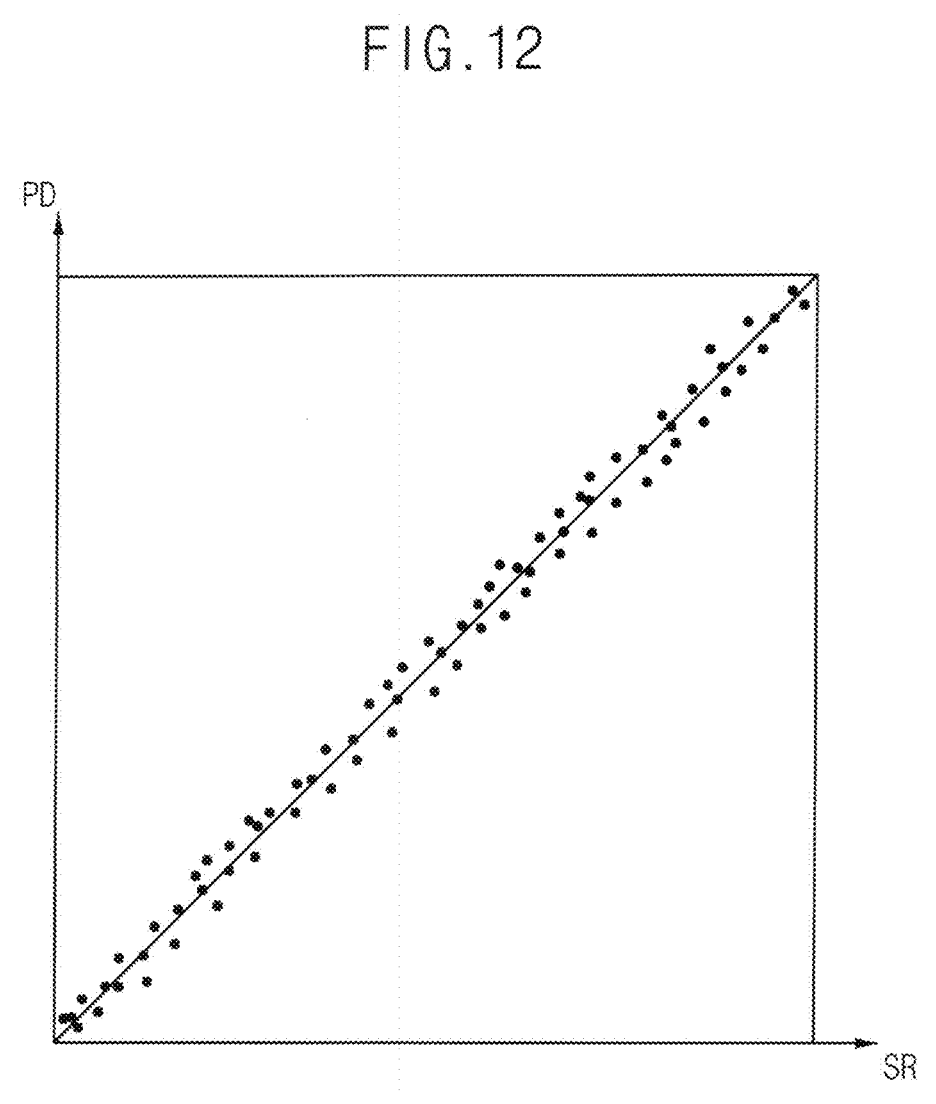

FIG. 12 is a diagram illustrating root mean square error (RMSE) of simulation result data and prediction data.

In FIG. 12, the horizontal axis indicates the simulation result data SR of the TCAD simulator and the vertical axis indicates the prediction data PD of the deep learning model.

Referring to FIG. 12, a root mean square error (RMSE) of the simulation result data SR of the TCAD simulator and the prediction data PD of the deep learning model may be determined with respect to a plurality of values of the input data, as represented by the following Expression 1.

$$RSME = [SUM(Si - Pi)^2]^{1/2}/n \qquad [\text{Expression 11}]$$

In Expression 1, Si and Pi indicates values of the simulation result data SR and the prediction data PD with respect to the same value of the input data, SUM indicates a summation for n different values of the input data. As the deep learning model is trained, the RMSE may approach zero.

The RMSE may be compared with a reference value, and the training completion of the deep learning model may be determined when the RMSE is smaller than the reference value. As the reference value is set to be smaller, the amount of the training data and the training time may be increased but the prediction performance of the deep learning model may be improved.

FIG. 13 is a flowchart illustrating a method of predicting characteristics of semiconductor device according to some example embodiments. At least a portion of the method may be performed by at least one processor executing program codes. The program codes may be stored, e.g., in computer readable media.

Referring to FIG. 13, basic training data corresponding to a combination of input data and simulation result data of previous semiconductor products may be generated using a technology computer aided design (TCAD) simulator (S101).

As described with reference to FIGS. 7 and 8, the basic training data may correspond to the previous semiconductor products. As described with reference to FIG. 9, the TCAD simulator may generate the simulation result data by performing a simulation based on the input data such that the simulation result data may indicate characteristics of semiconductor devices corresponding to the input data. As described with reference to FIG. 10, the input data may include device data and process data. The device data may indicate, e.g., structure and operation condition of the semiconductor device and the process data may indicate, e.g., condition of manufacturing process of the semiconductor device.

A deep learning model may be trained based on the basic training data such that the deep learning model is configured to output prediction data indicating the characteristics of the semiconductor devices and uncertainty data indicating uncertainty of the prediction data (S201). The simulation result data and the prediction data may indicate electrical characteristics of the semiconductor device.

Target prediction data may be generated based on the deep learning model and the input data corresponding to the target semiconductor product such that the target prediction data may indicate the characteristics of the semiconductor device included in the target semiconductor product (S301). As described above with reference to FIGS. 7 and 8, the target semiconductor product is a new semiconductor product that is not included in the previous semiconductor products.

The deep learning model may be retrained based on the uncertainty data (S401).

In some example embodiments, as will be described below with reference to FIG. 16, retraining may be performed such that the deep learning model that has been trained based on the basic training data is further trained based on the model uncertainty value.

As such, the method and the computing device according to some example embodiments may efficiently predict the characteristics of the semiconductor device included in the new semiconductor product, by generating the basic training data corresponding to the combinations of the input data and the simulation result data using the established technology computer aided design (TCAD) simulator with respect to the previous semiconductor products and training the deep learning model based on the basic training data.

In addition, the method and the computing device according to some example embodiments may provide the deep learning model configured to precisely predict the characteristics of the semiconductor device by training the deep learning model to output the prediction data indicating the characteristics of the semiconductor device and the uncertainty data indicating the uncertainty of the prediction data and retraining the deep learning model based on the uncertainty data.

Through the enhanced prediction performance of the deep learning model, the time and/or the cost of designing and/or manufacturing the semiconductor product including the semiconductor device and the performance of the semiconductor product may be enhanced.

Figure 14:
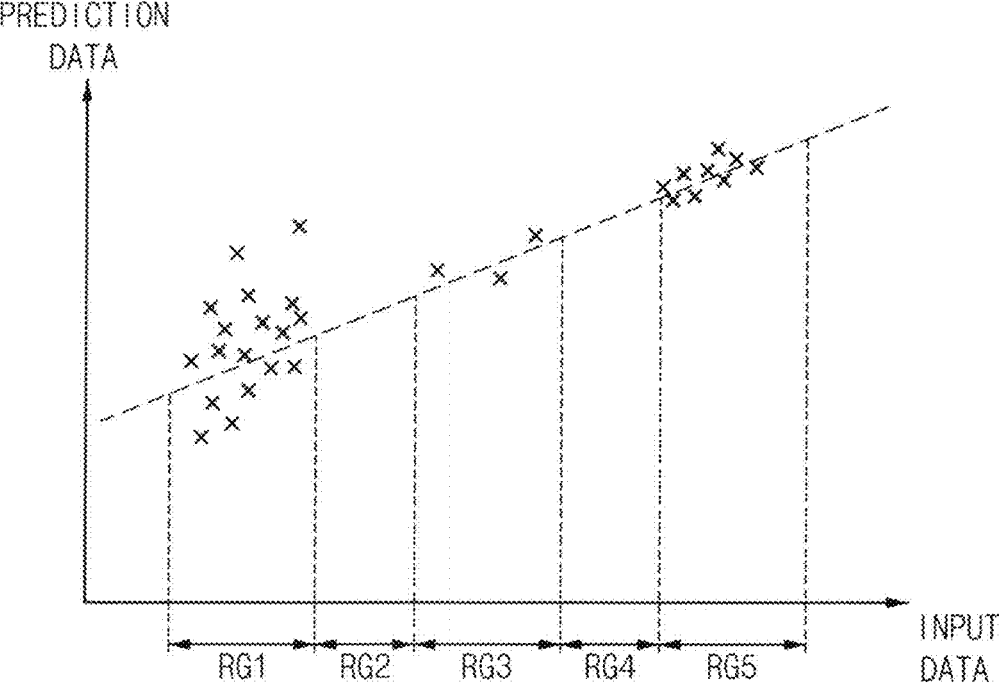
FIG. 14 is a diagram for describing types of uncertainty in a method of predicting characteristics of semiconductor device according to some example embodiments.

FIG. 14 is a diagram for describing types of uncertainty in a method of predicting characteristics of semiconductor device according to example embodiments.

In FIG. 14, the horizontal axis indicates input data of a deep learning model and the vertical axis indicates prediction data output from the deep learning model. FIG. 14 illustrates an example distribution of the prediction data provided using the deep learning model. The input data may be divided into first through fifth ranges RG1~RG5 according to the distribution of the prediction data.

In some example embodiments, the prediction data indicating the characteristics of the semiconductor device may increase linearly according to the input data. For example, the prediction data from an ideal deep learning model may coincide with a dotted line of a uniform slope in FIG. 14.

The prediction data have a relatively large distribution in the first range RG1 and have a relatively small distribution in the fifth range RG5.

The large distribution of the prediction data may be caused by noises of the input data and/or the training data. The uncertainty of the prediction data caused by noises of the training data may be referred to as data uncertainty (and/or aleatoric uncertainty).

In contrast, the uncertainty of the prediction data caused by insufficiency of the training data in the second and fourth ranges RG2 and RG4 may be referred to as model uncertainty (and/or epistemic uncertainty).

In some example embodiments, the uncertainty data output from the deep learning model may include a model uncertainty value indicating the uncertainty of the prediction data caused, e.g., by insufficiency of the basic training data. In these cases, as will be described below with reference to FIG. 16, retraining may be performed such that the deep learning model that has been trained based on the basic training data is further trained based on the model uncertainty value.

Example embodiments in this disclosure are for substituting the TCAD simulator with the deep learning model for new semiconductor products. For example, in some example embodiments, it may be assumed that the established TCAD simulator may provide simulation result data that may be reliable sufficiently. Thus, the data uncertainty caused by noises of the training data may not be considered and only the model uncertainty caused by insufficiency of the training data may be considered.

The deep learning model may be configured to output a model uncertainty value through quantification of the model uncertainty.

In some example embodiments, the deep learning model may include Bayesian Neural Network (BNN). The deep learning model may quantize the uncertainty using the Monte-Carlo Dropout scheme, the Deep Ensemble scheme, a quantile regression scheme, a Gaussian Process Inference scheme, a combination thereof, and/or the like.

Figure 15:
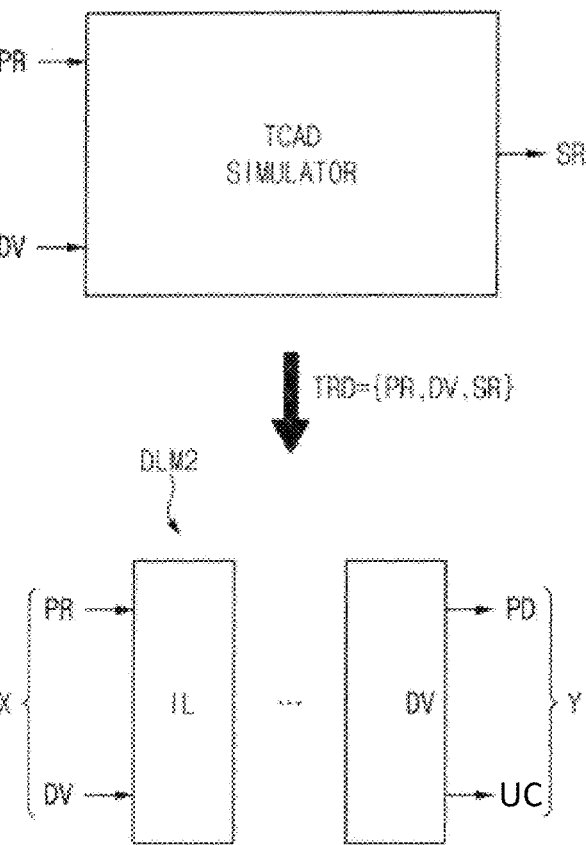
FIG. 15 is a diagram illustrating an example of a deep learning model in a method of predicting characteristics of semiconductor device according to some example embodiments.

FIG. 15 is a diagram illustrating an example of a deep learning model in a method of predicting characteristics of semiconductor device according to some example embodiments. For convenience of illustration, detailed configuration of a deep learning model is omitted and only an input layer IL receiving input data X and an output layer OL providing output data Y are illustrated in FIG. 15.

As described with reference to FIG. 9, respective databases have to be established with respect to each product and each product generation and thus the turn-around-time (TAT) for developing device models may be delayed and/or increased significantly. In general, predicting using the TCAD simulator has been a bottleneck of developing device models.

According to example embodiments, a combined database may be established based on the accumulated simulation result data of the previous semiconductor products and the TCAD simulator may be substituted with a deep learning model based on the combined database. The turn-around time for developing a new semiconductor product may be reduced significantly using the deep learning model substituting the TCAD simulator.

Referring to FIG. 15, a deep learning model DLM2 may be generated, which may replace a TCAD simulator. The basic training data TRD may be generated based on the simulation result data SR corresponding to the process data PR and the device data DV such that basic training data TRD correspond to a combination of the process data PR, the device data DV, and simulation result data SR. A plurality of basic training data TRD corresponding to different combinations may be generated based on different values of the process data PR and the device data DV.

In the example of FIG. 15, the input data X of the deep learning model DLM1 may include both of the process data PR1 and the device data DV. The output data Y may include the prediction data PD indicating the predicted characteristics of the semiconductor device and the uncertainty data UC indicating uncertainty of the prediction data. The supervised learning of the deep learning model DLM2 may be performed using the simulation result data SR as the ground-truth data with respect to the process data PR and the device data DV.

Figure 16:
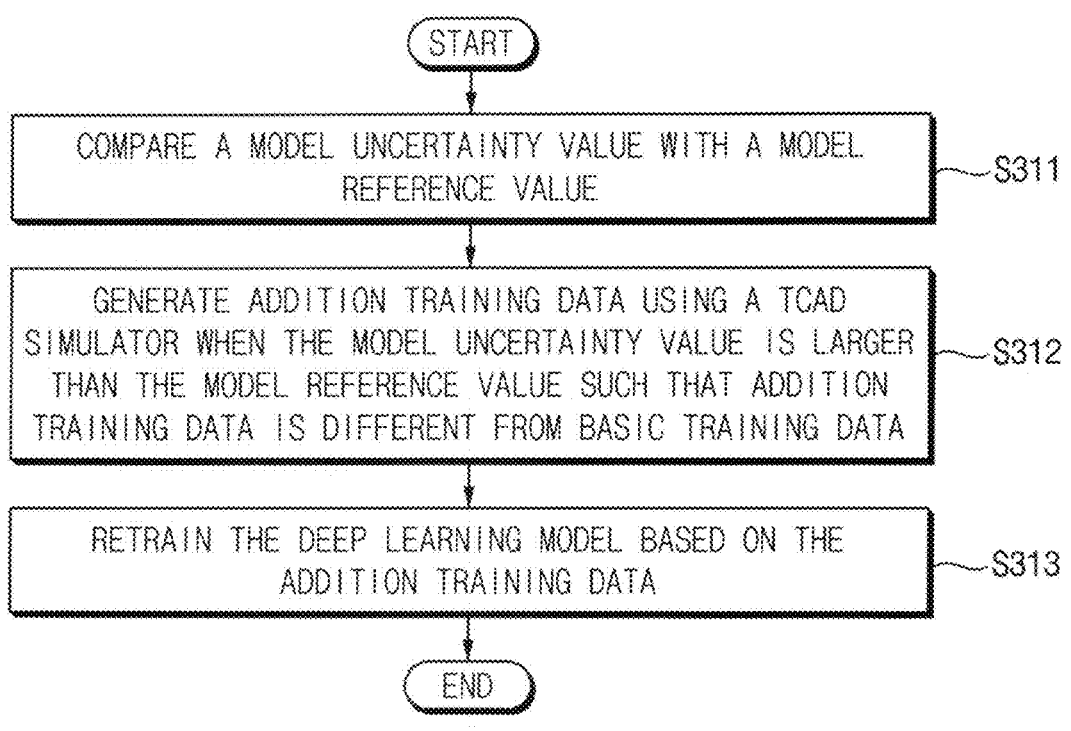
FIG. 16 is a flow chart illustrating an example of retraining based on model uncertainty value in a method of predicting characteristics of semiconductor device according to some example embodiments.
Figure 17:
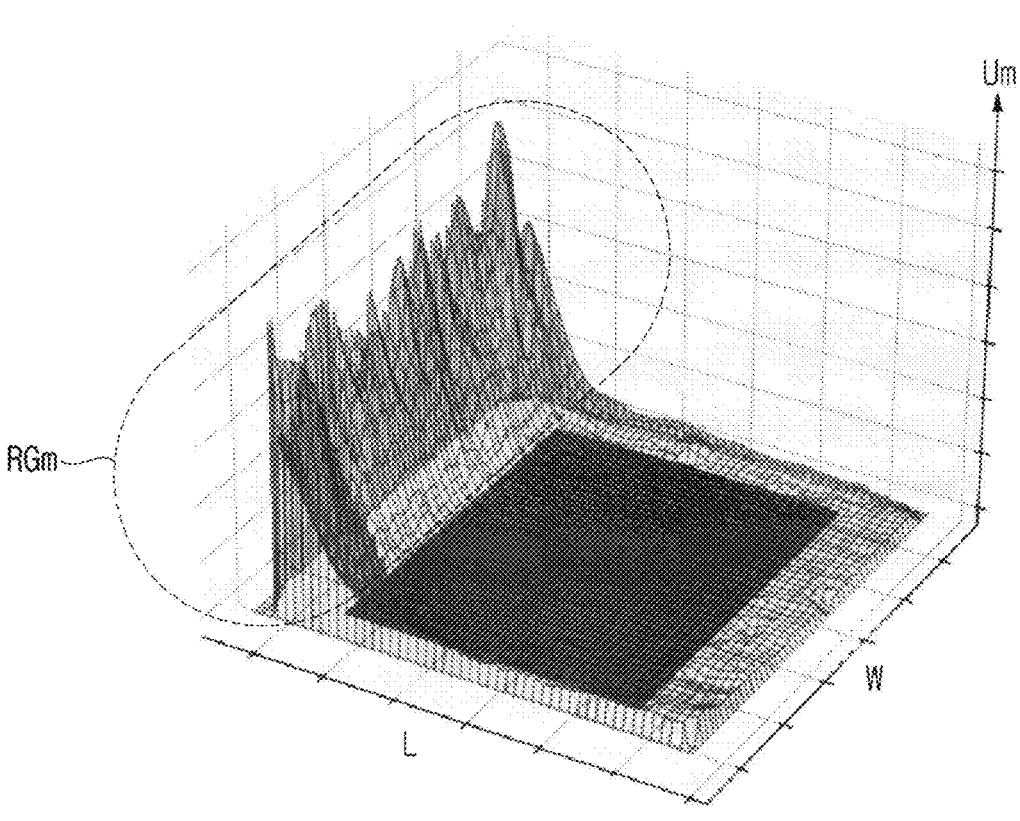
FIG. 17 is a diagram illustrating an addition data range in a method of predicting characteristics of semiconductor device according to some example embodiments.

FIG. 16 is a flow chart illustrating an example of retraining based on model uncertainty value in a method of predicting characteristics of semiconductor device according to some example embodiments, and FIG. 17 is a diagram illustrating an addition data range in a method of predicting characteristics of semiconductor device according to some example embodiments.

FIG. 16 illustrates a retraining such that the deep learning model that has been trained based on the basic training data is further trained based on the model uncertainty value.

Referring to FIGS. 2 and 16, the training control module 240 operated by at least one processor of the processors 110 may compare the model uncertainty value with a model reference value (S311). As described above, the model uncertainty value may indicate the uncertainty of the prediction data caused by insufficiency of the basic training data. The model reference value may be determined as a proper value depending on target performance of the trained deep learning model.

When the model uncertainty value is larger than the model reference value, addition training data different from the basic training data may be generated using the TCAD simulator (S312). The training control module 240 may retrain the deep learning model based on the addition training data (S313). The training control module 240 may, for example, not initialize the deep learning model that has been trained based on the basic training data and retrain the deep learning model additionally based on the addition training data.

FIG. 17 illustrates an example distribution of the model uncertainty value provided from the trained deep learning model. In FIG. 17, the horizontal axes indicate the length L and the width W of a transistor, and the vertical axis indicates the model uncertainty value Um.

The training control module 240 may determine an addition data range RGm corresponding to a range of data such that the model uncertainty value Um is larger than the model reference value. The training control module 240 may generate the addition training data such that the addition training data may correspond to a combination of the device data included in the addition data range and the corresponding simulation result data.

As described above, the method and the computing device according to the example embodiments may efficiently predict the characteristics of the semiconductor device included in the new semiconductor product, by generating the basic training data corresponding to the combinations of the input data and the simulation result data using the established technology computer aided design (TCAD) simulator with respect to the previous semiconductor products and training the deep learning model based on the basic training data.

In addition, the method and the computing device according to the example embodiments may provide the deep learning model configured to precisely predict the characteristics of the semiconductor device by training the deep learning model to output the prediction data indicating the characteristics of the semiconductor device and the uncertainty data indicating the uncertainty of the prediction data and retraining the deep learning model based on the uncertainty data.

Through the enhanced prediction performance of the deep learning model, the time and/or the cost of designing and/or manufacturing the semiconductor product including the semiconductor device and the performance of the semiconductor product may be enhanced.

As will be appreciated by one skilled in the art, the example embodiments in this disclosure may be embodied as a system, method, computer program product, and/or a computer program product embodied in one or more computer readable medium(s) having computer readable program code embodied thereon. The computer readable program code may be provided to a processor of a general purpose computer, special purpose computer, and/or other programmable data processing apparatus. The computer readable medium may be a computer readable signal medium and/or a computer readable storage medium. The computer readable storage medium may be any tangible medium that can contain, and/or store a program for use by or in connection with an instruction execution system, apparatus, or device.

In this disclosure, the functional blocks denoting elements that process (and/or perform) at least one function or operation and may be included in and/or implemented as processing circuitry such hardware, software, or the combination of hardware and software. For example, the processing circuitry more specifically may include (and/or be included in), but is not limited to, a processor, Central Processing Unit (CPU), a controller, an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. For example, the term "model" and "module" may refer to a software component and/or a hardware component such as a field programmable gate array (FPGA) or an application specific integrated circuit (ASIC), and/or combination of a hardware component and a software component. However, a "model" and/or "module" is not limited to software or hardware. A "model" and/or "module" may be configured to be included in an addressable storage medium or to reproduce one or more processors. Accordingly, for example, a "model" and/or "module" may include components such as software components, object-oriented software components, class components, and task components, processes. functions, attributes, procedures, subroutines, segments of program code, drivers, firmware, microcode, circuits, data, databases, data structures, tables, arrays, and variables. A function provided in components, models, and/or modules may be integrated with a smaller number of components and/or divided into additional components.

The example embodiments may be applied to designing and manufacturing any electronic devices and systems. For example, the inventive concepts may be applied to systems such as a memory card, a solid state drive (SSD), an embedded multimedia card (eMMC), a universal flash storage (UFS), a mobile phone, a smart phone, a personal digital assistant (PDA), a portable multimedia player (PMP), a digital camera, a camcorder, a personal computer (PC), a server computer, a workstation, a laptop computer, a digital TV, a set-top box, a portable game console, a navigation system, a wearable device, an internet of things (IoT) device, an internet of everything (IoE) device, an e-book, a virtual reality (VR) device, an augmented reality (AR) device, a server system, an automotive driving system, etc.

The foregoing is illustrative of some example embodiments and is not to be construed as limiting thereof. Although a few example embodiments have been described, those skilled in the art will readily appreciate that many modifications are possible in the example embodiments without materially departing from the present inventive concepts.

What is claimed is:

1. A method of predicting characteristics of a semiconductor device included in a target semiconductor product, the method performed by at least one processor executing program codes, the program codes stored in computer readable media, the method comprising:

generating basic training data corresponding to a combination of input data and simulation result data of previous semiconductor products, the basic training data generated using a technology computer aided design (TCAD) simulator, the simulation result data generated by performing a simulation based on the input data of the TCAD simulator, wherein the simulation result data indicate characteristics of semiconductor devices corresponding to the input data of the TCAD simulator;

training a deep learning model based on the basic training data, wherein the deep learning model is configured to output prediction data indicating the characteristics of the semiconductor devices and a model uncertainty value indicating an uncertainty of the prediction data caused by insufficiency of the basic training data;

determining, based on the model uncertainty value exceeding a model reference value, an addition data range corresponding to a range of the input data of the TCAD simulator;

generating addition training data corresponding to a combination of the input data of the TCAD simulator included in the addition data range and the simulation result data;

retraining the deep learning model based on the addition training data; and generating target prediction data based on the retrained deep learning model and input data corresponding to the target semiconductor product, wherein the target prediction data indicates the characteristics of the semiconductor device included in the target semiconductor product.

2. The method of claim 1, wherein the target semiconductor product is a new semiconductor product that is not included in the previous semiconductor products.

3. The method of claim 1, wherein at least one of the input data of the TCAD simulator or the input data corresponding to the target semiconductor product is based on a process-group combination of a process type and a product group, the process type indicating a manufacturing process of a semiconductor product, and the product group indicating a group in which the semiconductor product is included.

4. The method of claim 3, wherein the process-group combination of the target semiconductor product is a new process-group combination that is not included in process-group combinations of the previous semiconductor products.

5. The method of claim 1, wherein the previous semiconductor products and the target semiconductor product are memory devices.

6. The method of claim 1, wherein at least one of the input data of the TCAD simulator or the input data corresponding to the target semiconductor product includes process data indicating condition of manufacturing processes of a semiconductor product and device data indicating structure and operation condition of the semiconductor device.

7. The method of claim 1, wherein the input data of the TCAD simulator includes process data and device data, and the input data corresponding to the target semiconductor product includes process data and device data.

8. The method of claim 1, wherein training the deep learning model includes:
    determining a training completion of the deep learning model based on a difference between the simulation result data of the TCAD simulator and the prediction data of the deep learning model.

9. The method of claim 1, wherein training the deep learning model includes:
    determining a root mean square error (RMSE) of the simulation result data of the TCAD simulator and the prediction data of the deep learning model with respect to a plurality of values of the input data of the TCAD simulator;
    comparing the RMSE with a reference value; and
    determining a training completion of the deep learning model when the RMSE is smaller than the reference value.

10. The method of claim 1, wherein retraining the deep learning model further includes: further training the deep learning model based on the basic training data and based on the addition training data.

11. The method of claim 1, wherein the deep learning model includes a Bayesian Neural Network (BNN).

12. A method of predicting characteristics of a semiconductor device included in a target semiconductor product, the method performed by at least one processor executing program codes, the program codes stored in computer readable media, the method comprising:
    generating basic training data corresponding to a combination of input data and simulation result data of previous semiconductor products generated by a technology computer aided design (TCAD) simulator, the simulation result data generated by performing a simulation based on the input data of the TCAD simulator, wherein the simulation result data indicate characteristics of semiconductor devices corresponding to the input data of the TCAD simulator, training a deep learning model based on the basic training data, wherein the deep learning model is configured to output prediction data indicating the characteristics of the semiconductor devices and a model uncertainty value data indicating an uncertainty of the prediction data caused by insufficiency of the basic training data;

determining, based on the model uncertainty value exceeding a model reference value, an addition data range corresponding to a range of the input data of the TCAD simulator;
    generating addition training data corresponding to a combination of the input data of the TCAD simulator included in the addition data range and the simulation result data;
    retraining the deep learning model based on the addition training data; and
    generating target prediction data based on the retrained deep learning model and input data corresponding to the target semiconductor product, wherein the target prediction data indicates the characteristics of the semiconductor device included in the target semiconductor product.

13. The method of claim 12, wherein the input data includes process data indicating condition of manufacturing processes of a semiconductor product, and device data indicating structure and operation condition of the semiconductor device.

14. The method of claim 12, wherein training the deep learning model includes: determining a training completion of the deep learning model based on a difference between the simulation result data of the TCAD simulator and the prediction data of the deep learning model.

15. A computing device comprising:
    at least one processor, and
    a computer readable medium storing program codes and basic training data, the basic training data corresponding to a combination of input data and simulation result data of previous semiconductor products, the basic training data generated by a technology computer aided design (TCAD) simulator, the simulation result data generated by performing a simulation based on the input data of the TCAD simulator, wherein the simulation result data indicate characteristics of semiconductor devices corresponding to the input data of the TCAD simulator,
    wherein the at least one processor executes the program codes to
    train a deep learning model based on the basic training data, wherein the deep learning model is configured to output prediction data indicating the characteristics of semiconductor devices and a model uncertainty value indicating an uncertainty of the prediction data caused by insufficiency of the basic training data;
    determining, based on the model uncertainty value exceeding a model reference value, an addition data range corresponding to a range of the input data of the TCAD simulator;
    generating addition training data corresponding to a combination of the input data of the TCAD simulator included in the addition data range and the simulation result data;
    retraining the deep learning model based on the addition training data; and
    generate target prediction data based on the retrained deep learning model and the input data corresponding to a target semiconductor product, wherein the target prediction data indicates the characteristics of the semiconductor device included in the target semiconductor product.

* * * * *